United States Patent [19]

Parekh et al.

[11] 4,293,099

[45] Oct. 6, 1981

[54] RECOVERY OF SILICON CARBIDE WHISKERS FROM COKED, CONVERTED RICE HULLS BY FROTH FLOTATION

[75] Inventors: Bhupendra K. Parekh; William M. Goldberger, both of Columbus, Ohio

[73] Assignee: Silag, Inc., Greer, S.C.

[21] Appl. No.: 53,737

[22] Filed: Jul. 2, 1979

[51] Int. Cl.³ .............................................. B02C 23/18
[52] U.S. Cl. ........................................ 241/24; 209/5; 209/166; 241/16
[58] Field of Search ................. 209/166, 3, 5; 241/20, 241/24, 16

[56] References Cited

U.S. PATENT DOCUMENTS

| | | | |
|---|---|---|---|
| 1,510,983 | 10/1924 | Dolbear | 209/166 X |
| 2,553,444 | 5/1951 | Dunn | 209/166 X |
| 3,248,277 | 4/1966 | Gartner | 209/166 X |
| 3,259,243 | 7/1966 | Watson | 209/166 |
| 3,319,785 | 5/1967 | Schroll | 209/166 |
| 3,394,893 | 7/1968 | Moss | 209/166 X |
| 3,462,262 | 8/1969 | Cutler | 423/345 |
| 3,589,622 | 6/1971 | Weston | 209/166 X |
| 3,802,632 | 4/1974 | Dancy | 209/3 X |
| 3,806,044 | 4/1974 | Rosar | 209/3 X |
| 4,182,498 | 1/1980 | Goldberger | 241/24 |

FOREIGN PATENT DOCUMENTS 105055  6/1917  United Kingdom ................ 209/166

Primary Examiner—Robert Halper
Attorney, Agent, or Firm—Kenneth P. Glynn; Robert S. Salzman

[57] ABSTRACT

The present invention is directed to silicon carbide whisker recovery from a mixture of silicon carbide whiskers and carbonaceous silicon carbide particles. The invention involves shredding the mixture down to a specified particle size, dispersing the mixture in water to form an aqueous mixture, agitating the aqueous mixture, adding surface active reagents to the aqueous mixture, agitating the resulting water-reagent mixture, subjecting the water-reagent mixture to froth flotation having at least three stages, removing tailings therefrom containing water and silicon carbide whiskers and removing float therefrom containing reagents and carbonaceous silicon carbide particles, performing a solid-liquid separation on the tailings and the float, thereby obtaining from the aqueous solution the desired silicon carbide whiskers and obtaining from the reagent solution a carbonaceous silicon carbide particle product.

7 Claims, 1 Drawing Figure

RECOVERY OF SILICON CARBIDE WHISKERS FROM COKED, CONVERTED RICE HULLS BY FROTH FLOTATION

BACKGROUND OF THE INVENTION

1. Field of the Invention

The present invention is directed to a method of recovering silicon carbide whiskers from a mixture of silicon carbide whiskers and carbonaceous silicon carbide particles. More particularly, the present invention is directed to such recovery by using a series of specified steps including froth flotation separation.

2. Prior Art

Silicon carbide whiskers have in recent years been found to be particularly useful for reinforcing metal and other composite materials so as to enhance the physical properties thereof. Thus, for example, U.S. Pat. No. 4,060,412 to A. P. Divecha describes the use of microscopic silicon carbide fibers in a mixture with metal particles so as to be randomly oriented, and the subsequent extrusion and casting to form very high strength composite material billets.

Silicon carbide whiskers may be produced using elemental materials such as is described in U.S. Pat. No. 3,758,672 wherein solid phase carbon and solid phase silicon are heated to specified temperatures in a hydrogen and chlorine atmosphere to form silicon carbide whiskers on a substrate. Alternatively, silicon carbide whiskers have been produced from natural materials such as is described in U.S. Pat. No. 3,754,076 wherein the silicon carbide whiskers are formed from the silica and the carbon which are naturally present in rice hulls. Each technique has its advantages and disadvantages. However, the method of producing silicon carbide from rice hulls appears to be more advantageous in that it is a method whereby one of the most abundant waste materials in the world is consumed. Nonetheless, when rice hulls are used as a starting material for the production of silicon carbide whiskers, a substantial amount of non-whisker residual material remains and an area of developing interest involves the separation of the silicon carbide whiskers from the other residual materials. To date, it is believed that relatively well-known mechanical screening and sifting means have been employed to separate the silicon carbide whiskers from residual materials with a minimum success, when formed from rice hulls.

Although the prior art is replete with many techniques for separating various solid materials from one another, it is believed that the method of the present invention employing a froth flotation separation as well as other necessary steps, has not heretofore been contemplated or rendered obvious. Exemplary of the prior art in U.S. Pat. No. 3,243,284 which describes a method for collecting metal whiskers. This patent describes a process wherein the metal whisker growth substrate is immersed in mercury and wherein the mercury and substrate are vibrated and a liquid is added to the mercury which is non-reactive with respect to the whiskers and which is mixed with the mercury to transport the whiskers from the mercury into the liquid, followed by filtering. U.S. Pat. No. 3,439,801 is directed to a process for removing discoloring impurities which may be organic or graphitic in nature from a clay slip. The method described in this patent involves intimately contacting an aqueous slip of fine milled clay with a water insoluble, non-ionizable organic liquid and thereupon recovering the clay from the separated clay water base. The organic liquid is the sole chemical reagent necessary for the effective separation of the discoloring impurities from the fine milled clay in the slip. While this patent is directed to a liquid/liquid separation technique involving the use of water and a water insoluble non-ionizable organic liquid, it is not directed to the separation of whisker materials from other solids, much less the separation of silicon carbide whiskers made from rice hulls.

U.S. Pat. No. 3,462,262 describes a process for the recovery of excess carbon from the product of an iron ore direct reduction process. The method involves treating the iron ore containing the carbon with oil followed by flotation in water. U.S. Pat. No. 3,764,007 is directed to the separation of solid particles from solid particles having a different shape. The invention therein is directed to a process for such a separation using a suspension, without turbulence, at a specified velocity profile using rotary movement of two discs. U.S. Pat. No. 3,865,315 is directed to a process for separating fibrous material such as wool fiber from mixtures of fibrous material and adhered shot without substantially destroying the fiber length. This method involves passing a water suspension of the fibrous material and adhered shot through an attrition device to gently abrade the fiber shot interface, then diluting the abraded mixture with water, agitating the diluted mixture, and decanting to separate the substantially unbroken fibers from the now separated shot. While this patent is directed to removing fibrous material from shot material, it does not employ a froth flotation separation technique but rather relies ultimately upon gravity for removal of the shot.

U.S. Pat. No. 3,920,446 is directed to a method for treating siliceous materials to form silicon carbide for use in refining ferrous material. The method involves heating mixtures of SiC and iron product at elevated temperatures comminuting the resulting product from the heat treatment and separating the metallic iron from the silicon carbide magnetically. U.S. Pat. No. 3,836,356 is also directed to a process wherein metal iron is removed from silicon carbide residue magnetically. U.S. Pat. No. 3,665,066 is directed to beneficiation of coals using liquid agglomeration techniques and U.S. Pat. No. 3,268,071 is likewise directed to a process for the separation of solids by agglomeration using liquid/liquid techniques. U.S. Pat. No. 4,118,464 is directed to a process for separating silica from silicate bearing materials and includes discussion of the formation and separation of silicon carbide from such materials. It is disclosed that the silicon carbide fibers obtained by the process may be separated by a suitable conventional mechanical screen process at which time there may be obtained an excellent separation of the silicon carbide from a carbon matrix residue and other materials. While this patent is directed to separation of silicon carbide from carbonaceous materials, it does not describe the use of a liquid/liquid separation technique.

Lastly, O. Mellgren et al, *Trans. Inst. Min. Metall.*, Vol. 75, pp. C267-C268, 1966 describe a method for recovering ultrafine mineral particles by extraction with an organic phase and an aqueous phase. R. W. M. Lai et al, *Transactions of Society of Mining Engineers,/AIME*, Vol. 241, December, 1968, pp. 549-556, describe liquid/liquid extraction of ultrafine particles using water-oil separation, and J. R. Farnand et al, *The*

*Canadian Journal of Chemical Engineering*, April, 1961, pp. 94-97 describe spherical agglomeration of solids in liquid suspension. I. E. Puddington et al, in *Minerals Science Engineering*, Volume 7, No. 3, October, 1975, describe spherical agglomeration processes and include a discussion on mineral beneficiation using liquid techniques.

In summary, of all the prior art described herein, there is no teaching of the present invention nor is there any teaching that would render the present invention obvious.

BRIEF DESCRIPTION OF THE INVENTION

The present invention is directed to silicon carbide whisker recovery from a mixture of silicon carbide whiskers and carbonaceous silicon carbide particles. The invention involves shredding the mixture down to a specified particle size in order to liberate the silicon carbide whiskers from the carbonaceous silicon carbide particles, dispersing the shredded mixture in water to form an aqueous mixture of hydrophilic silicon carbide whiskers and hydrophobic carbonaceous silicon carbide particles, agitating the aqueous mixture to further liberate said hydrophilic silicon carbide whiskers from said hydrophobic carbonaceous silicon carbide particles, adding surface active reagents to the aqueous mixture, agitating the resulting water-reagent mixture, subjecting the water-reagent mixture to froth flotation having at least three stages, removing tailings therefrom containing water and silicon carbide whiskers and removing float therefrom containing reagents and carbonaceous silicon carbide particles, performing a solid-liquid separation on the tailings and, thereby obtaining from the aqueous solution the desired silicon carbide whiskers. The carbonaceous silicon carbide particle product can also be recovered from the reagent solution.

DETAILED DESCRIPTION OF THE PRESENT INVENTION

Figure 1:
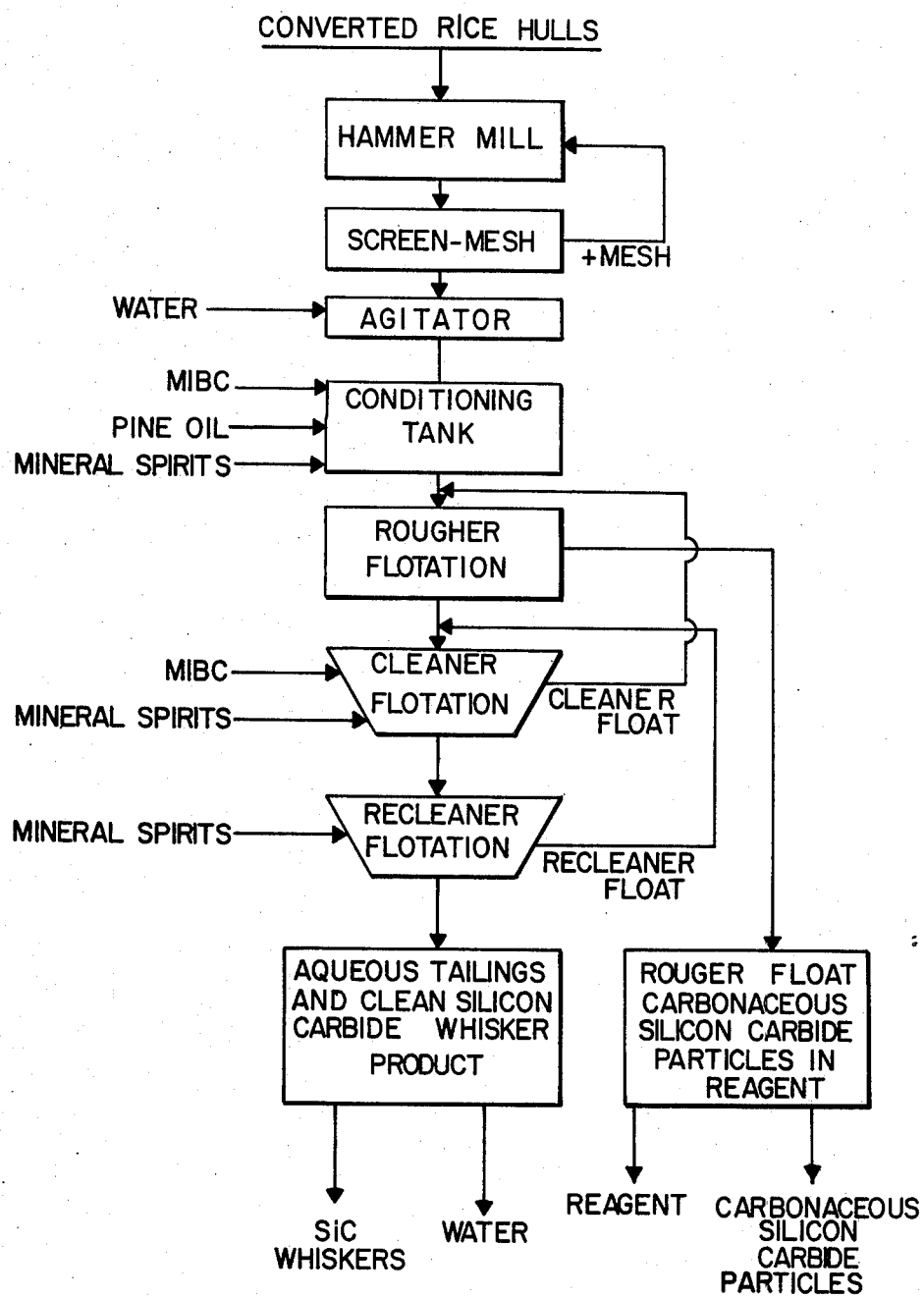
FIG. 1 shows a flow diagram on a step-by-step basis of a preferred embodiment of the method of the present invention for the separation and recovery of silicon carbide whiskers from a mixture of silicon carbide whiskers and carbonaceous silicon carbide particles.

Silicon carbide may be formed by conversion of rice hulls at elevated temperatures under selected atmospheric conditions as described in the prior art above. The resulting silicon carbide whiskers, formed from the silica and the carbon content of the rice hulls, also contain non-whisker silicon carbide and unreacted carbon or coke material. In view of the fact that less than all of the silicon carbide produced is whisker-like, it has been recognized that silicon carbide whiskers and silicon carbide particles are both hydrophilic and that, therefore, liquid/liquid separation techniques employing water as one of the media would not be effective. Thus, for example, one technique which may be used for separating the whiskers from the silicon carbide non-whisker particles and the carbonaceous material involves burning off the carbonaceous material at very high temperatures, and then removing the silicon carbide particles from the silicon carbide whiskers by mechanical means.

It has now been discovered that silicon carbide whiskers which are grown from rice hulls are formed into a natural mat of the whiskers and silicon carbide particles and carbonaceous material and, most importantly, that the silicon carbide particles are either coated with or otherwise connected to the carbonaceous materials. It has further been discovered that controlled shredding of the mat without excess pressure and without harsh milling will break up the fibrous mat without separating the carbonaceous material coatings from the silicon carbide particles. The silicon carbide whiskers are naturally hydrophilic and the carbonaceous silicon carbide is found to be hydrophobic. By using these unique characteristics of the materials, froth flotation separation may be effected. Thus, the present invention is directed to a method of separating silicon carbide whiskers from carbonaceous silicon carbide particles.

The method of the present invention involves first shredding the silicon carbide whiskers and carbonaceous silicon carbide so as to break up the fibrous mat which is naturally formed in the silicon carbide whiskers growing process. This shredding step may advantageously be performed using a hammer mill shredder or its equivalent. In fact, any shredder may be employed provided that the carbonaceous silicon carbide particles contained in the mixture which is being worked on are not broken up so as to separate the carbonaceous material from the silicon carbide particles. Whether or not a particular shredding technique would be detrimental to the carbonaceous silicon carbide particles may be determined by micrographic inspection, or alternatively, by following the process of the present invention to determine whether or not it is effective.

Shredding of the mat containing the silicon carbide whiskers and the carbonaceous silicon carbide particles should be performed until a maximum particle size of −10 mesh, and preferably −5 mesh, is obtained. In addition to shredders, apparatus such as screens may be employed. While screening is optional and the specified size particles may be obtained with shredders such as a hammer mill, screening provides an excellent quality control mechanism. In either case, the shredding is essential to the method of the present invention. Thus, it is by this shredding down to the specified size that a partial liberation of the whiskers from the carbonaceous silicon carbide particles is effected without detrimentally harming the integrity of the carbonaceous silicon carbide particles which remain with the whiskers.

The next step in the method of the present invention involves dispersing the shredded silicon carbide whisker-carbonaceous silicon carbide particle mixture in water. In general, dispersion in water is carried out so as to yield a solution of about 1 to about 15% by weight of solids and preferably from about 5 to about 10% by weight of these solids. If desired, optional dispersing agents such as sodium pyrophosphate, sodium metaphosphate and sodium silicate may be employed. Of these, a preferred dispersing agent is sodium silicate.

After the materials are dispersed in water, the resulting mixture is subjected to agitation. This agitation enhances the final liberation of the silicon carbide whiskers from the carbonaceous silicon carbide particles and the dispersion thereof in the water. The agitation may be carried out by using ultrasonics, by a mechanical blender technique using, for example, a Waring blender, or the materials may otherwise be agitated by a mechanical agitator or any other type of agitator which will not harm the integrity of the carbonaceous silicon carbide particles and the whiskers.

After agitation, surface active reagents are added to the aqueous mixture. Any surface active reagent may be employed which will wet the carbon surface effectively, including kerosene, pine oil, mineral spirits, light fuel oils and the like. However, it has been discovered that a combination of surface active agents may be advantageous because it is an essential aspect of the present invention to subsequently employ froth flotation of at least three stages. In general, a ratio of about one part by volume of reagents to about 130 parts of aqueous dispersion up to a ratio of about 1 part by volume of reagents to about 200 parts by volume of aqueous dispersion may be employed. Within this range, a ratio of 1 part by volume of reagents to about 130 parts by volume of aqueous dispersion up to about 1 part by volume of reagents to about 150 parts by volume of aqueous dispersion is preferred.

In one preferred embodiment, a mixture of methyl isobutyl carbinol (MIBC), pine oil and mineral spirits is employed as the reagent. In general, about 0.64 to about 1.92 pounds per ton of MIBC, about 0.68 to about 2.00 pounds per ton of pine oil and about 150 to about 300 pounds per ton of mineral spirits is employed, based on the total amount of these three reagents. In general, this reagent mixture is added to the aqueous mixture in relative amounts as set forth above.

After the reagent and the aqueous dispersion are mixed, agitating (conditioning) is employed. The conditioning involves stirring the suspension in the flotation cell machine with air valves closed.

The next step involves subjecting the water-reagent mixture to froth flotation having at least three stages and preferably having only three stages. In general, the at least three stage froth flotation system may be arranged in any tailings-float series that are known in the art, and conventional recycling back of floats from down-stream stages to preceding stages is advantageous. Froth creation likewise may be achieved by any known technique, e.g., sparging. The froth (float) may be removed by scraping and it has been found that scraping is preferable to skimming.

In general, the tailings are removed from a "bottoms" or liquid portion of the most downstream stage and the float is removed from a "tops" or froth portion of an upstream stage. The froth which is removed from the flotation process contains reagents and carbonaceous silicon carbide particles. The tailings which are removed from the flotation process contain water and silicon carbide whiskers.

Next, solid-liquid separations on the tailings and the froth are performed, thereby obtaining the desired SiO whiskers from the aqueous tailings and obtaining carbonaceous silicon carbide particles from the reagent float. Any solid-liquid separation, e.g., centrifugation, sedimentation, filtering, may be employed.

In one preferred embodiment, a three-stage flotation is used wherein certain reagents are added to the various stages to enhance the process. This preferred embodiment is outlined in FIG. 1. As shown, converted rice hulls (silicon carbide whiskers and carbonaceous silicon carbide particles in mat form) are shredded in a hammer mill and passed through a mesh screen, e.g. 5 mesh. Larger (plus mesh) materials are recycled for more hammer mill shredding. The shredded material is mixed with water and them agitated. Next a reagent mixture of MIBC, pine oil and mineral spirits is added to the aqueous mixture. The resultant mixture is agitated in a conditioning tank and passes through a three-stage flotation process as shown. The stages are designated rougher flotation, cleaner flotation and recleaner flotation. During this process, MIBC and mineral spirits are added to the cleaner flotation and mineral spirits are added to the recleaner flotation to enhance the process. Rougher float is removed from the rougher flotation and the bottoms are fed to the cleaner flotation. The cleaner float is recycled and fed back into the rougher flotation: and, the recleaner float is recycled and fed back into the cleaner flotation. The tailings from the cleaner flotatation are fed to the recleaner flotation and the (final) tailings from the recleaner flotation are removed from the system. Subsequently, silicon carbon whiskers are separated from the aqueous tailings mixture and carbonaceous silicon carbide particles are separated from the rougher float containing the reagent.

Equivalent and alternative steps to those described specifically above should now be apparent to the artisan without exceeding the scope of the present invention. The present invention is more fully illustrated by the following examples.

EXAMPLE 1

Converted rice hull product as obtained from an induction furnace was found to consist of a mat which could not be dispersed as such in water. Photomicrographs of the coked and converted rice hulls showed carbonaceous silicon carbide particles embedded loosely in a mat of silicon carbide whiskers. Because the carbonaceous silicon carbide particles and the whiskers appeared to be loosely attached, it was considered feasible to disperse the converted material in water and subsequently separate the liberated silicon carbide whiskers from the carbonaceous hulls by virtue of the difference in surface properties of the two materials. Thus, it was assumed that the silicon carbide particles containing the carbonaceous material thereon would act as if it were carbon and be hydrophobic. The silicon carbide whiskers which contained little or no carbonaceous material were hydrophilic. Since, as mentioned, the mat obtained from the induction furnace could not be dispersed as such in water, the material was shredded in a hammer mill shredder and subsequently classified so as to pass through a five mesh (0.15") screen. This shredded material was used for the liberation and dispersion of the silicon carbide. Next, about one gram of material was dispersed in approximately 200 cc of water. Agitation was effected with an ultrasonic device which consisted of a horn attached to an ultrasonic transducer driven by an ultrasonic generator. The horn was submerged in the aqueous suspension and operated to produce vibrations of about 20,000 hertz using approximately 100 watts of power for a period of about 5 minutes. At the end of this agitation the material appeared to be completely liberated and dispersed. However, separation studies conducted on this type of suspension showed that a substantial amount of submicron size carbonaceous silicon carbide particles remained present with the whisker product. Thus, it was recognized that further separation would be required.

As an alternative to the ultrasonic device, a Waring blender was used to agitate one gram of the mat in 500 cc of water for a period of about two minutes. The blender was operated at a minimum speed of about 3,000 rpm. Separation studies conducted on this dispersed material indicated that the length of the whiskers was slightly shortened. It was concluded that, while this agitation technique could be used, it was not as advantageous as ultrasonics and, that further separation would be required.

As a second alternative, an agitator machine was used for liberation studies which consisted of a spiral of horizontal blades. This agitator device was attached to a mechanism whereby the revolutions per minute of impact could be controlled. For this study, approximately 50 grams of shredded material was placed in 500 cc of water and agitated at 700 rpm for about 5 minutes. The whiskers in the dispersed suspension appeared liberated to a great degree without any change in their length.

Shredded silicon carbide whiskers with carbonaceous silicon carbide particles which had been classified was dispersed in water using a Denver agitator machine. The dispersion was then conditioned for 5 minutes in a flotation cell (2-liter capacity) using a small amount of MIBC (methyl isobutyl carbinol), pine oil, and mineral spirits. On introducing air through the suspension, a black froth was generated at the top of the suspension. The removal of froth was continued till a poor froth, which did not contain many black particles, started coming to the surface. The froth so obtained was called rougher float. The tailings (aqueous suspension) left in the cell were transferred to another flotation cell and small amounts of MIBC and mineral spirits were added. On sparging air through the liquid, more black material floated off from the suspension. This step was referred to as cleaner flotation and the froth obtained, the cleaner float. The cleaner tailings were then transferred to another flotation cell and a few milliliters of mineral spirits added. In this flotation step, the last traces of black material were removed. This step was called recleaner flotation and the froth, recleaner float. The recleaner tailing was the final product containing silicon carbide whiskers. The weights of solids in each float and final tailings were determined by filtering, drying, and weighing the filter cake.

Data for this experiment is listed in Table 1, below. In this experiment, 1.28 pounds MIBC, 0.68 pounds of pine oil, and 228.0 pounds (or 25.8 gallons) of mineral spirits per ton were used. The recleaner tailings (approximately 20 weight percent) consisted of silicon carbide whiskers. The cleaner and recleaner floats also had some whiskers present in them. These whiskers could be recovered by further flotation treatment.

TABLE 1
FROTH FLOTATION EXPERIMENT DATA ON SEPARATION OF WHISKERS FROM CONVERTED RICE HULLS

| Product | Weight, g | Weight Percent | Remarks |
|---|---|---|---|
| Recleaner tails | 16.95 | 20.0 | Only whiskers present |
| Recleaner float | 7.66 | 9.0 | Whiskers and hull mixture |
| Cleaner float | 16.89 | 20.0 | Whiskers and hull mixture |
| Rougher float | 42.87 | 51.00 | Only carbonaceous hulls |
| Total | 84.37 | 100.00 | |

The products obtained were filtered through Whatman No. 2 filter paper. Filtration of recleaner tailings (whiskers) took a longer time compared to filtration of floats which mainly consisted of larger size hull particles. SEM photomicrographs of the rougher float and recleaner tailings show that the recleaner tailings essentially consist of silicon carbide whiskers.

EXAMPLES 2–5

Effects of Percent Solids in Suspension

In the froth-flotation technique, the amount of solids present in the flotation pulp plays an important part in separation of solids. For fine-size solids, separation using a dilute suspension of solids is recommended for an effective separation.

In the present system, the material consists of a mixture of fine- and coarse-size solids; hence, flotation studies were conducted at various concentrations of solids (e.g., at 1.0, 2.5, 5.0, and 10.0 weight percent solids). The experimental data obtained are summarized in Table 2. Note that the amount of cleaner tailings (whiskers) recovered was reduced significantly when the amount of solids was increased to 10 percent in the flotation pulp. An optimum separation and recovery of cleaner tails were obtained at 5 percent solids concentration.

TABLE 2
EFFECT OF CONCENTRATION OF CONVERTED MATERIAL ON SEPARATION OF WHISKERS USING THE FROTH-FLOTATION TECHNIQUE

| Example No. | Percent Solids | Products | Weight Percent | Remarks |
|---|---|---|---|---|
| 2 | 1.0 | Tailings | 20.0 | Reagents: MIBC (0.64 lb/t) |
|  |  | Froth | 80.0 | Pine Oil (0.68 lb/t) |
|  |  |  |  | Mineral Spirits (304 lb/t or 47.8 gallons/t) |
|  |  |  |  | Tailings consist of whiskers |
| 3 | 2.5 | Tailings | 9.6 | Reagents: MIBC (0.64 lb/t) |
|  |  | Froth | 91.4 | Pine Oil (0.68 lb/t) |
|  |  |  |  | Mineral Spirits (212 lb/t or 33.5 gallons/t) |
|  |  |  |  | Tailings consist of clean whiskers |
| 4 | 5.0 | Cleaner Tails | 18.3 | Reagents: MIBC (1.28 lb/t) Pine Oil (0.68 lb/t) |
|  |  | Cleaner Froth | 18.8 | Mineral Spirits (152 lb/t or 23.9 gallons/t) |
|  |  | Rougher Froth | 62.9 | Cleaner tails consist of whiskers |
| 5 | 10.0 | Cleaner Tails | 8.8 | Reagents: MIBC (1.92 lb/t) Pine Oil (2.04 lb/t) |
|  |  | Cleaner Froth | 51.6 | Mineral Spirits (106.4 lb/t or 16.7 gallons/t) |
|  |  | Rougher Froth | 39.6 | Cleaner tails consist of whiskers |

EXAMPLES 6–8

Effect of Various Flotation Reagents

Various flotation reagents have been reported and used for an effective flotation of carbon. In the present study, MIBC, pine oil, and mineral spirits in combination were found to be the most effective in separation of whiskers from the carbonaceous hull particles. To determine a reagent which may be as effective as mineral spirits, but can be used in lesser quantities, experiments were conducted using kerosene No. 2 fuel oil, and coaltar creosote (Examples 6, 7 and 8, respectively).

It was found that kerosene responded very similarly to the mineral spirits and the amount required for flotation of carbonaceous hulls was approximately 212 pounds per ton (or 33.5 gallons per ton) of converted material. The amount required is the same as that required with mineral spirits. In fact, kerosene and mineral spirits are very similar in their structural properties.

The other reagents, i.e., No. 2 fuel oil and coaltar creosote, did not respond effectively. When these reagents were used, the froth was not rich with solids and addition of mineral spirits became necessary to produce a rich froth.

EXAMPLES 9–10

Effect of Dispersing Agents

A dispersing agent (also called dispersant) is effectively used to disperse fine particles in aqueous suspension. An effective and efficient separation of particles is achieved when they are completely liberated and dispersed.

In the present study, flotation experiments were conducted using the two well-known dispersants, i.e., sodium pyrophosphate and sodium silicate. Data for Examples 9 and 10 are listed in Table 3. In Example 9, 2.0 pounds of sodium pyrophosphate, 1.28 pounds of MIBC, 0.68 pounds of pine oil, and 182.4 pounds (or 28.7 gallons) of mineral spirits per ton were used. In this experiment, approximately 20 weight percent of whiskers was recovered.

TABLE 3

EFFECT OF DISPERSANTS ON SEPARATION OF WHISKERS FROM CONVERTED RICE HULLS

| Product | Weight, g | Weight Percent | Remarks |
|---|---|---|---|
| Example 9[a] | | | |
| Cleaner tails | 20.86 | 20.5 | Mostly whiskers |
| Cleaner float | 12.34 | 12.1 | Whiskers, hulls mixture |
| Rougher float | 66.50 | 67.4 | Mostly hulls |
| Total | 101.70 | 100.0 | |
| Example 10[b] | | | |
| Recleaner tails | 8.50 | 16.8 | Mostly whiskers |
| Recleaner float | 1.92 | 3.9 | Whiskers, hulls mixture |
| Cleaner float | 12.32 | 24.3 | Whiskers, hulls mixture |
| Rougher float | 27.88 | 55.0 | Mostly hulls |
| Total | 50.62 | 100.0 | |

[a] 2.0 pounds of sodium pyrophosphate per ton was used.
[b] 0.8 pounds of sodium silicate per ton was used.

In example 10, 0.8 pounds of sodium silicate, 1.28 pounds of MIBC, 0.68 pounds of pine oil, and 304 pounds (or 47.8 gallons) of mineral spirits per ton were used. Sodium silicate is also known to act as a depressant (reduces flotation) of silica. As silicon carbide and silica are similar in surface chemical properties, it was judged that sodium silicate would help suppress flotation of silicon carbide whiskers. The total recovery of whiskers in this case was approximately 17 weight percent. The amount of whiskers obtained with the addition of dispersants did not show any significant improvement over those obtained without the addition of dispersants.

EXAMPLE 11

Effect of Temperature

In froth flotation of certain minerals, high-temperature flotation makes a significant difference. In the present study, an experiment was conducted to evaluate the effect of higher temperature on flotation of carbonaceous hulls.

A froth-flotation experiment was conducted at a temperature of 46 C. (115 F.). The experimental procedure consisted of conditioning the feed suspension at a high temperature with flotation reagents and then floating it at the same temperature.

Visual observation of the experiment did not indicate any significant change in the flotation. The amount of reagents required was 1.28 pounds of MIBC, 0.68 pounds of pine oil, and 304 pounds (or 47.8 gallons) of mineral spirits per ton. The final whisker product was approximately 19.0 weight percent. This showed that high-temperature flotation does not offer any improvement over the experiment conducted at room temperature.

EXAMPLES 12 and 13

Effect of pH

The pH of the aqueous suspension is also another important criterion in flotation of minerals. In the present study, flotation of the converted material was conducted in the acidic region (pH 4.0) and in alkaline region (pH 11.0). Experimental data obtained are listed in Table 4. The total amount of whiskers (recleaner tailings) obtained in both experiments remains the same. However, the amount of carbonaceous solids reject is significantly higher in the alkaline pH range than in the acidic range. Visual observation also indicated that the rougher float was richer in solids at pH 11.0 compared with pH 4.0 as revealed by scanning and transmission electron microscope photomicrographs of the recleaner tailings obtained.

TABLE 4

EFFECT OF pH ON FROTH-FLOTATION SEPARATION OF WHISKERS

| Product | Example 12 pH 4.0 Weight Percent | Example 13 pH 11.0 Weight Percent | Remarks |
|---|---|---|---|
| Recleaner tailings | 15.0 | 15.2 | Whiskers |
| Recleaner float | 5.3 | 4.6 | Whiskers, hulls mixture |
| Cleaner float | 28.9 | 1.4 | Whiskers, hulls mixture |
| Rougher float | 50.8 | 78.6 | Hulls |

Reagents:  MIBC = 1.28 pounds per ton
Pine Oil = 0.68 pounds per ton
Mineral Spirits = 270 pounds per ton (or 43 gallons per ton)

EXAMPLES 14–16

Characterization of Products

The final clean whiskers and the rougher float products obtained in some of the froth-flotation experiments were analyzed for their carbon content. The results are listed in Table 5. It shows that the final whisker product contains approximately 1 percent or less carbon.

TABLE 5
CARBON CONTENT OF ROUGHER FLOAT AND RECLEANER TAILINGS

| Example | Percent Carbon in Rougher Float Product | Percent Carbon in Clean Whisker Product |
|---|---|---|
| 14 | 25.2 | 0.20 |
| 15 | 20.6 | 0.98 |
| 16 | 17.97 | 1.04 |
| Bulk Combined[a] | 14.10 | 1.10 |

[a]Sample from combined products of various experiments.

A sample of clean whiskers obtained by combining a few experimental products was also analyzed using the optical emission spectroscopy technique to determine the amount of various metals present. The analytical data is listed in Table 6, which indicates that most of the foreign metals present are in very small quantities except calcium, magnesium, and manganese, which are 0.5, 0.2, and 0.2 percent, respectively.

TABLE 6
OPTICAL EMISSION SPECTROSCOPY ANALYSIS OF THE RECLEANER TAILINGS (WHISKERS)

| Element | Percent |
|---|---|
| Al | 0.02 |
| Ba | 0.01 |
| Ca | 0.50 |
| Cu | 0.02 |
| Fe | 0.05 |
| Mg | 0.20 |
| Mn | 0.20 |
| Si | Major |
| Ti | 0.02 |
| V | 0.02 |

EXAMPLE 17

Development of Flowsheet

Based on the experimental data obtained, quantitative aspects for the flowsheet of FIG. 1 can now be developed for the various operations required for obtaining silicon carbide whiskers from the converted material. According to the flowsheet, the converted material mat may be shredded in a hammer mill to pass through a 5-mesh screen. The minus 5-mesh shredded material may be slurried in water and fed to an agitator for dispersing the material. It may then be transferred to a conditioning tank where 0.64 pounds of MIBC, 0.68 pounds of pine oil, and 150.0 pounds (23.5 gallons) of mineral spirits per ton of solids may be added. The conditioned slurry may then go to the rougher flotation circuit, where the carbonaceous hulls may be removed in the froth (rougher float) and filtered. The rougher tailings may be pumped to the cleaner flotation circuit where 0.64 pounds of MIBC and 60.0 pounds (or 9.5 gallons) of mineral spirits per ton of solids may be added. The cleaner froth may be recycled back to the rougher flotation circuit. The cleaner tailings may be pumped to the recleaner flotation cell where 30.4 pounds (or 4.8 gallons) of mineral spirits per ton of solids may be added. The recleaner froth may be recycled back to the cleaner flotation cells. The recleaner tailings consisting of silicon carbide whiskers may then be dewatered, filtered, and dried.

What is claimed is:

1. A method for separating silicon carbide whiskers produced from a high temperature conversion of rice hulls and containing a mixture of silicon carbide whiskers with carbonaceous silicon carbide particles, consisting:
   (i) shredding the mixture in a controlled manner down to a specified particle size of approximately −10 mesh in order to liberate the silicon carbide whiskers from the carbonaceous silicon carbide particles without removing the carbonaceous material coating from said carbonaceous silicon carbide particles;
   (ii) dispersing the shredded mixture in water so as to contain about 1 to 15% by weight of solids to form an aqueous mixture of hydrophilic silicon carbide whiskers and hydrophobic carbonaceous silicon carbide particles;
   (iii) agitating the aqueous mixture to further liberate said hydrophilic silicon carbide whiskers from said hydrophobic carbonaceous silicon carbide particles;
   (iv) adding surface active reagents to the aqueous mixture, which surface active reagents wet the carbon surface of said carbonaceous silicon carbide particles;
   (v) agitating the resulting water-reagent mixture;
   (vi) subjecting the water-reagent mixture to froth flotation having at least three stages;
   (vii) removing tailings therefrom containing water and silicon carbide whiskers and removing float therefrom containing reagents and carbonaceous silicon carbide particles; and
   (viii) performing a solid-liquid separation on the tailings, thereby obtaining silicon carbide whiskers from the aqueous mixture tailings.

2. The method of claim 1 wherein said surface active reagents are added to said aqueous mixture in a volume ratio of about 1 to 130 up to about 1 to 200.

3. The method of claim 1 wherein said shredded mixture is dispersed in water so as to contain about 5 to 10% by weight of solids.

4. The method of claim 1 wherein said surface active reagents are comprised of a mixture of methyl isobutyl carbinol, pine oil and mineral spirits.

5. The method of claim 1 wherein said surface active reagents are added to said aqueous mixture in a volume ratio of about 1 to 130 up to about 1 to 150.

6. The method of claim 1, 4, 3 or 5 wherein said shredding is accomplished with a hammer mill.

7. The method of claim 1, wherein the carbonaceous silicon carbide non-whisker particles are obtained from the float by solid-liquid separation.

* * * * *